(12) United States Patent
Subramanyam et al.

(10) Patent No.: US 7,692,270 B2
(45) Date of Patent: Apr. 6, 2010

(54) FERROELECTRIC VARACTORS SUITABLE FOR CAPACITIVE SHUNT SWITCHING

(75) Inventors: Guru Subramanyam, Dayton, OH (US); Andre Vorobiev, Gothenburg (SE); Spartak Gevorgian, Gothenburg (SE)

(73) Assignee: University of Dayton, Dayton, OH (US)

( * ) Notice: Subject to any disclaimer, the term of this patent is extended or adjusted under 35 U.S.C. 154(b) by 431 days.

(21) Appl. No.: 10/575,754

(22) PCT Filed: Oct. 15, 2004

(86) PCT No.: PCT/US2004/034266

§ 371 (c)(1),
(2), (4) Date: Apr. 3, 2007

(87) PCT Pub. No.: WO2005/043669

PCT Pub. Date: May 12, 2005

(65) Prior Publication Data

US 2007/0176217 A1    Aug. 2, 2007

Related U.S. Application Data

(60) Provisional application No. 60/512,631, filed on Oct. 20, 2003.

(51) Int. Cl.
*H01P 7/10*       (2006.01)
(52) U.S. Cl. ...................................... 257/601; 333/164

(58) Field of Classification Search ................. 257/595, 257/601; 333/164
See application file for complete search history.

(56) References Cited

U.S. PATENT DOCUMENTS 5,227,748 A    7/1993   Sroka (Continued)

*Primary Examiner*—Thomas L Dickey
(74) *Attorney, Agent, or Firm*—Dinsmore & Shohl LLP

(57) ABSTRACT

A ferroelectric varactor suitable for capacitive shunt switching is disclosed. High resistivity silicon with a $SiO_2$ layer and a patterned metallic layer deposited on top is used as the substrate. A ferroelectric thin-film layer deposited on the substrate is used for the implementation of the varactor. A top metal electrode is deposited on the ferroelectric thin-film layer forming a CPW transmission line. By using the capacitance formed by the large area ground conductors in the top metal electrode and bottom metallic layer, a series connection of the ferroelectric varactor with the large capacitor defined by the ground conductors is created. The large capacitor acts as a short to ground, eliminating the need for vias. The concept of switching ON and OFF state is based on the dielectric tunability of the ferroelectric thin-films. At 0 V, the varactor has the highest capacitance value, resulting in the signal to be shunted to ground, thus isolating the output from the input. This results in the OFF state of the switch. By applying a small voltage to the center conductor of the CPW, the varactor's capacitance can be reduced allowing the signal to be transmitted through resulting in the ON state of the device. Such a varactor shunt switch eliminates majority of problems plaguing the RF MEMS shunt switches.

33 Claims, 12 Drawing Sheets

U.S. PATENT DOCUMENTS

| | | | |
|---|---|---|---|
| 5,576,564 A * | 11/1996 | Satoh et al. ............... 257/295 |
| 5,640,042 A | 6/1997 | Koscica et al. |
| 5,721,194 A | 2/1998 | Yandrofski et al. |
| 6,018,282 A | 1/2000 | Tsuda |
| 6,084,503 A | 7/2000 | Ruile et al. |
| 6,097,263 A * | 8/2000 | Mueller et al. ............. 333/17.1 |
| 6,404,614 B1 | 6/2002 | Zhu et al. |
| 6,454,914 B1 | 9/2002 | Nakamura |
| 6,639,491 B2 | 10/2003 | Toncich |
| 6,646,522 B1 | 11/2003 | Kozyrev et al. |
| 6,727,535 B1 | 4/2004 | Sengupta et al. |
| 7,030,463 B1 | 4/2006 | Subramanyam et al. |
| 7,109,818 B2 | 9/2006 | Rivkina et al. |
| 7,145,415 B2 | 12/2006 | Sengupta et al. |
| 2002/0163408 A1 | 11/2002 | Fujii et al. |
| 2002/0186099 A1 | 12/2002 | Sengupta et al. |
| 2006/0152303 A1 | 7/2006 | Liang et al. |

FOREIGN PATENT DOCUMENTS

| | | |
|---|---|---|
| WO | WO 01/15260 A1 | 3/2001 |
| WO | WO 2005/043669 A1 | 5/2005 |

OTHER PUBLICATIONS

Kuylenstierna et al "40 GHz Lumped Element Tunable Bandpass Filters with Transmission Zeros Based on Thin Ba<0.25>Sr<0.75>TiO<3> (BST) Film Varactors", 2006 Topical Meeting on Silicon Monolithic Integrated Circuits in RF Systems (IEEE Cat. No. 06EX1204) IEEE Piscataway, NJ Jan. 18-20, 2006, pp. 342-345.

International Search Report and Written Opinion for International application No. PCT/US2007/080368 dated Apr. 17, 2008.

Jeremy B. Muldavin & Gabriel M. Rebeiz, High Isolation CPW MEMS Shunt Switches Part 1: Modeling, IEEE Transactions on Microwave Theory and Techniques, Dec. 1999.

Gabriel M. Rebiez & Jeremy B. Muldavin, RF MEMS Switches and Switch Circuits, IEEE Microwave Magazine, Dec. 2001.

D. Kuylenstierna, A. Vorobiev, G. Subramanyam and S. Gevorgian, Tunable Electromagnetic Bandgap Structures Based on Ferroelectric films, IEEE, 2003.

D. Kuylenstierna, G. Subramanyam, A. Vorobiev, A. Vorobiev and S. Gevorgian, Tunable Electromagnetic Bandgap Performance of Coplanar.

Waveguides Periodically Loaded by Ferroelectric Varactors, Microwave and Optical Technology Letters, vol. 39, No. 2, Oct. 20, 2003.

D. Kuylenstierna, G. Subramanyam, A. Vorobiev, A. Vorobiev and S. Gevorgian, Tuneable Electromagnetic Bandgap Structures Based on Ba0.25Sr0.75Ti03.

Parallel-Plate Varactors on Silicon Coplanar Waveguides, 33rd European Microwave Conference—Munich 20003.

Faruque Ahamed and Guru Subramanyam, Design of Si MMIC Compatible Ferroelectric Varactor Shunt Switch for Microwave Applications.

Office Action mailed Mar. 27, 2009 in U.S. Appl. No. 11/494,066, filed Jul. 27, 2006.

Office Action mailed Jul. 9, 2008 in U.S. Appl. No. 11/494,066, filed Jul. 27, 2006.

Office Action mailed Aug. 16, 2007 in U.S. Appl. No. 11/494,066, filed Jul. 27, 2006.

Office Action mailed Dec. 28, 2006 in U.S. Appl. No. 11/494,066, filed Jul. 27, 2006.

* cited by examiner

FERROELECTRIC VARACTORS SUITABLE FOR CAPACITIVE SHUNT SWITCHING

The present invention relates to ferroelectric varactors, and in particular, to a ferroelectric varactor that is suitable for a capacitive shunt switch.

Electrically tunable microwave filters have many applications in microwave systems. These applications include local multipoint distribution service (LMDS), personal communication systems (PCS), frequency hopping radio, satellite communications, and radar systems. There are three main kinds of microwave tunable filters, mechanically, magnetically, and electrically tunable filters. Mechanically tunable filters are usually tuned manually or by using a motor. They suffer from slow tuning speed and large size. A typical magnetically tunable filter is the YIG (Yttrium-Iron-Garnet) filter, which is perhaps the most popular tunable microwave filter, because of its multioctave tuning range, and high selectivity. However, YIG filters have low tuning speed, complex structure, and complex control circuits, and are expensive.

One electronically tunable filter is the diode varactor-tuned filter, which has a high tuning speed, a simple structure, a simple control circuit, and low cost. Since the diode varactor is basically a semiconductor diode, diode varactor-tuned filters can be used in monolithic microwave integrated circuits (MMIC) or microwave integrated circuits. The performance of varactors is defined by the capacitance ratio, $C_{max}/C_{min}$, frequency range, and figure of merit, or Q factor at the specified frequency range. The Q factors for semiconductor varactors for frequencies up to 2 GHz are usually very good. However, at frequencies above 2 GHz, the Q factors of these varactors degrade rapidly.

Since the Q factor of semiconductor diode varactors is low at high frequencies (for example, <20 at 20 GHz), the insertion loss of diode varactor-tuned filters is very high, especially at high frequencies (>5 GHz). Another problem associated with diode varactor-tuned filters is their low power handling capability. Since diode varactors are nonlinear devices, larger signals generate harmonics and subharmonics.

Varactors that utilize a thin film ferroelectric ceramic as a voltage tunable element in combination with a superconducting element have been described. For example, U.S. Pat. No. 5,640,042 discloses a thin film ferroelectric varactor having a carrier substrate layer, a high temperature superconducting layer deposited on the substrate, a thin film dielectric deposited on the metallic layer, and a plurality of metallic conductive means disposed on the thin film dielectric, which are placed in electrical contact with RF transmission lines in tuning devices. Another tunable capacitor using a ferroelectric element in combination with a superconducting element is disclosed in U.S. Pat. No. 5,721,194.

With the advent of microelectromechanical system (MEMS) technology, attention has been focused on the development of MEMS devices for radio frequency (RF) applications. MEMS switches are one of the most prominent micromachined products that have attracted numerous research efforts in numerous years and have many potential applications such as impedance matching networks, filters, signal routing in RF system front-end and other high frequency reconfigurable circuits. MEMS switches provide many advantages over conventional electromechanical or solid-state counterparts in terms of low insertion loss, high isolation, low power consumption, high breakdown voltage, high linearity and high integration capability. The majority of today's MEMS switches employ electrostatic actuation and require a high actuation voltage, a major drawback of this type of switch. Recently, high relative dielectric constant Barium Strontium Titanium Oxide (BST) thin-films have been used in RF MEMS switches as a dielectric layer for reducing the actuation voltage requirements as well as improving isolation. Isolation can be improved more than 10 dB using ferroelectric thin-films of BST compared to dielectric materials such as $Si_3N_4$.

However, RF MEMS switches have several limitations such as, for example, relatively low speed, low power handling capability, required high actuation voltage, low reliability, low switching lifetime and high packaging cost. Although improvements are being made in these areas, challenges remain for commercial applications of RF MEMS switches. A ferroelectric varactor based capacitive shunt switch can over come most of the limitations of existing RF MEMS switches.

It is against this background that the present invention is based on a coplanar waveguide (CPW) transmission line shunted by a ferroelectric varactor. The novelty in the implementation comes from the elimination any moving parts for switching and from the elimination of via connections. High resistivity silicon with a $SiO_2$ layer and a metallic layer deposited on top is used as the substrate. The substrate can be any low-loss microwave substrate such as, for example, Saphire, magnesium oxide, lanthanum aluminate, etc. A ferroelectric thin-film layer is deposited on a patterned bottom metal layer (metal1 layer) for the implementation of the varactor. A top metal electrode (metal2 layer) is deposited on the ferroelectric thin-film layer, and patterned to form a CPW transmission line, such that an overlapping area of the center conductor of the CPW in metal1 and the shorting line in metal2 layers defines the varactor area. By using the large area ground planes in the metal2 layer as well as the metal1 layer, a series connection of the ferroelectric varactor with the large capacitor defined by the ground planes on the top and bottom metal layers was created. The large capacitor acts as a short to ground, eliminating the need for any vias. The concept of switching ON and OFF state is based on the dielectric tunability of the BST thin-films.

Accordingly, it is an object of the present invention to create a varactor shunt switch with improved isolation and insertion loss with reduced bias voltage.

It is another object of the present invention to create a varactor shunt switch with lower bias voltage requirement, high switching speed, ease of fabrication and high switching lifetime.

Other objects of the present invention will be apparent in light of the description of the invention embodied herein.

The following detailed description of specific embodiments of the present invention can be best understood when read in conjunction with the following drawings, where like structure is indicated with like reference numerals and in which.

In the following detailed description of the preferred embodiments, reference is made to the accompanying drawings that form a part hereof, and in which are shown by way of illustration, and not by way of limitation, specific preferred embodiments in which the invention may be practiced. It is to be understood that other embodiments may be utilized and that logical, mechanical and electrical changes may be made without departing from the spirit and scope of the present invention.

The concept of implementing shunt capacitance will be useful for a large number of MMICs such as, for example, tunable one-dimensional and two-dimensional electromagnetic bandgap (EBG) structures, tunable band-reject and bandpass filters, interference suppression systems, microwave switching applications, distributed phase shifters for microwave and millimeterwave frequencies. Furthermore, the present invention is also suitable for two-dimensional and three-dimensional EBG arrays. In addition, these switches could be used in analog and digital applications, such as, for example, interlayer coupling in multi-layered packages, isolation of specific subsystems with a larger system. This type of switch could also serve as a sensory element, since ferroelectric thin-films manifest piezo-electricity (useful for pressure sensors, accelerometers, etc.), pyroelectricity (for infrared detectors), and electro-optic activity (voltage induced refractive index change for color filters, displays, optical switching, etc.).

Figure 1:
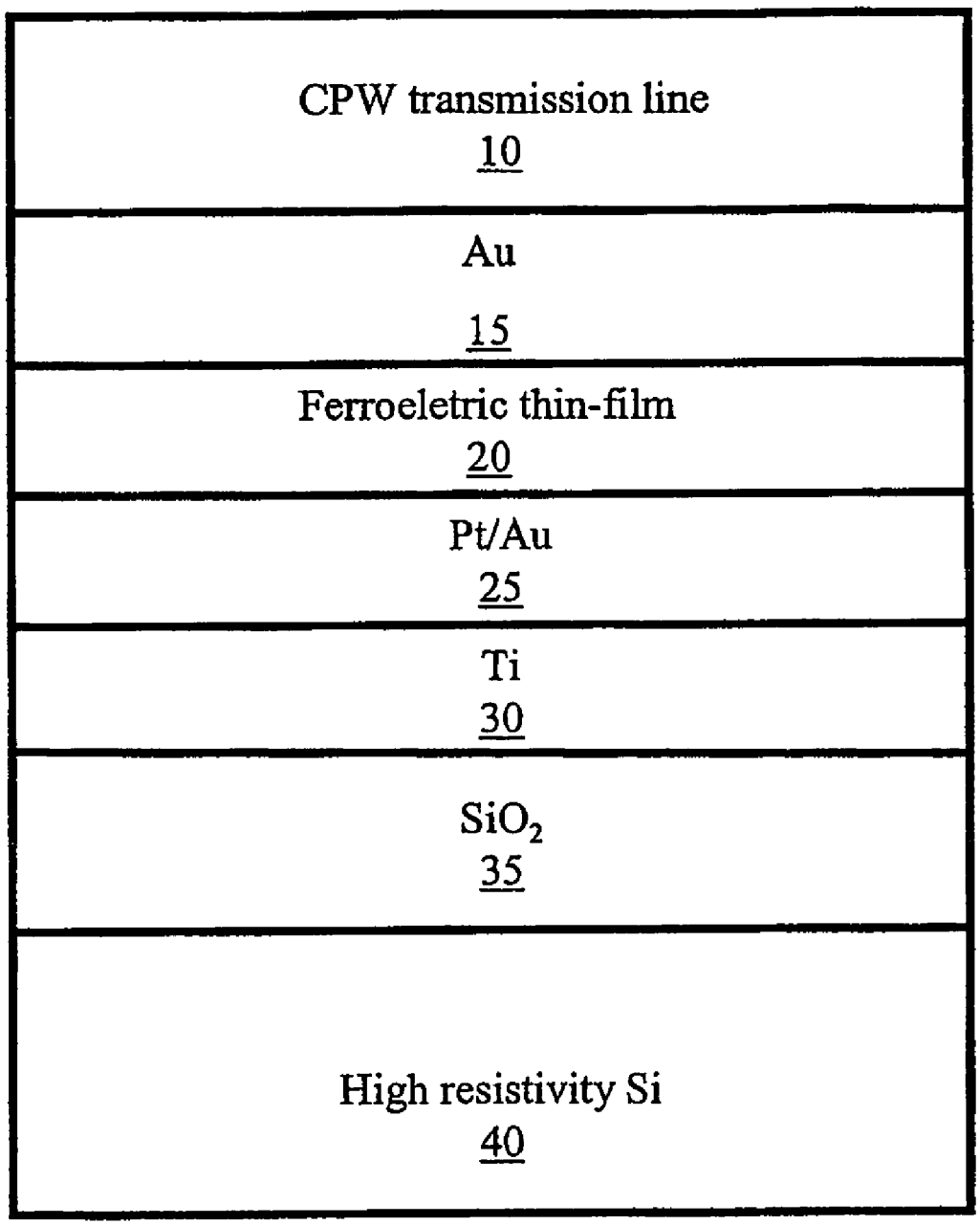
FIG. 1 illustrates a cross-sectional view of the multiple layers of the capacitive shunt switch according to one embodiment of the present invention.

FIG. 1 illustrates a cross-sectional view of the multiple layers of the varactor shunt switch. The varactor shunt switch is designed on CPW transmission line 10 with a multilayer substrate. A tunable ferroelectrical thin-film of BST 20 with a high dielectric constant ($\epsilon_r \geq 100$) is used as a dielectrical layer (400 nm thickness) on top of the platinum/gold layer 25 with a thickness of 500 nm. A titanium adhesion layer 30 of 20 nm is deposited between the platinum/gold layer 25 and the silicon oxide/high resistivity silicon substrate layer 35 and 40. The silicon has resistivity of >1 kΩ-cm and is typically about 6 kΩ-cm. The thickness of the silicon oxide layer 35 and the high resistivity silicon substrate 40 are 200 nm and 20 mils respectively.

Figure 2A:
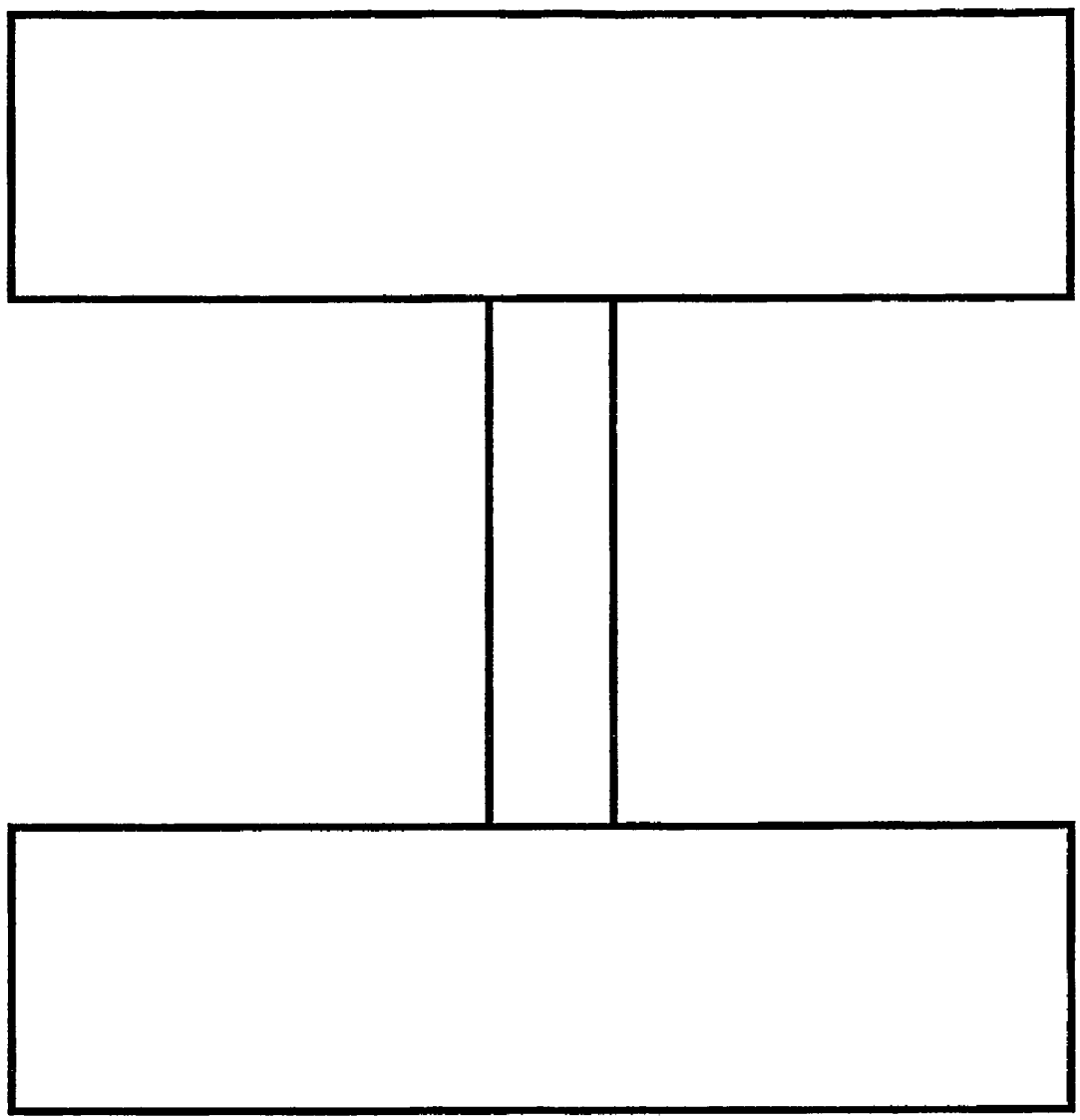
FIG. 2a is a pattern of the bottom metal electrode according to one embodiment of the present invention.

As a first step in the process, a patterned bottom electrode (metal1 layer) is processed on a Si/SiO$_2$ substrate by electron-beam (e-beam) deposition (or sputtering) and lift-off photolithography technique. FIG. 2a shows the pattern of the bottom metallic layer 25. After the lift-off photolithography process for the platinum/gold layer 25, the layer 25 is covered by a 400 nm ferroelectric thin film 20 such as, for example, barium strontium titanate (BST), strontium titanate (STO) or any other non-linear tunable dielectric, using a pulsed laser ablation (PLD) process or by RF sputtering. Note that the ferroelectric thin-film can be used in the paraelectric state or in the ferroelectric state to optimize the switch performance based on the type of application.

Figure 2B:
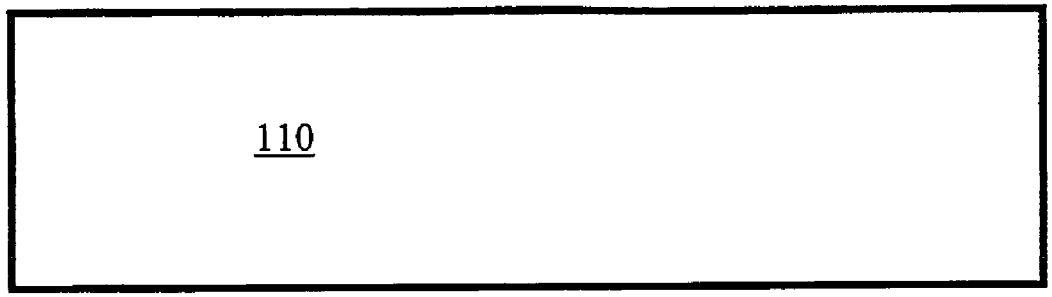
FIG. 2b is a pattern of the top metal electrode according to one embodiment of the present invention.
Figure 2B:
Figure 2B:
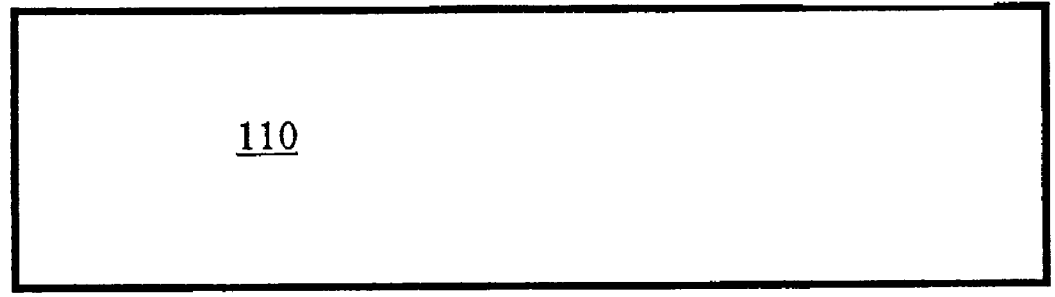

FIG. 2b illustrates the pattern of the top metal electrode 15 that is deposited on top of the ferroelectric thin film 20. This top metal electrode 15 is comprised of gold and includes the central signal strip 100 and the ground conductors 110 of the CPW. The top metal electrode 15 is prepared by e-beam deposition (or sputtering) and lift off photolithography process. The ground conductors in the bottom metallic layer 25 and top metal electrode 15 are effectively shorted, due to the large capacitance between these two layers, eliminating need for the via holes.

Figure 2C:
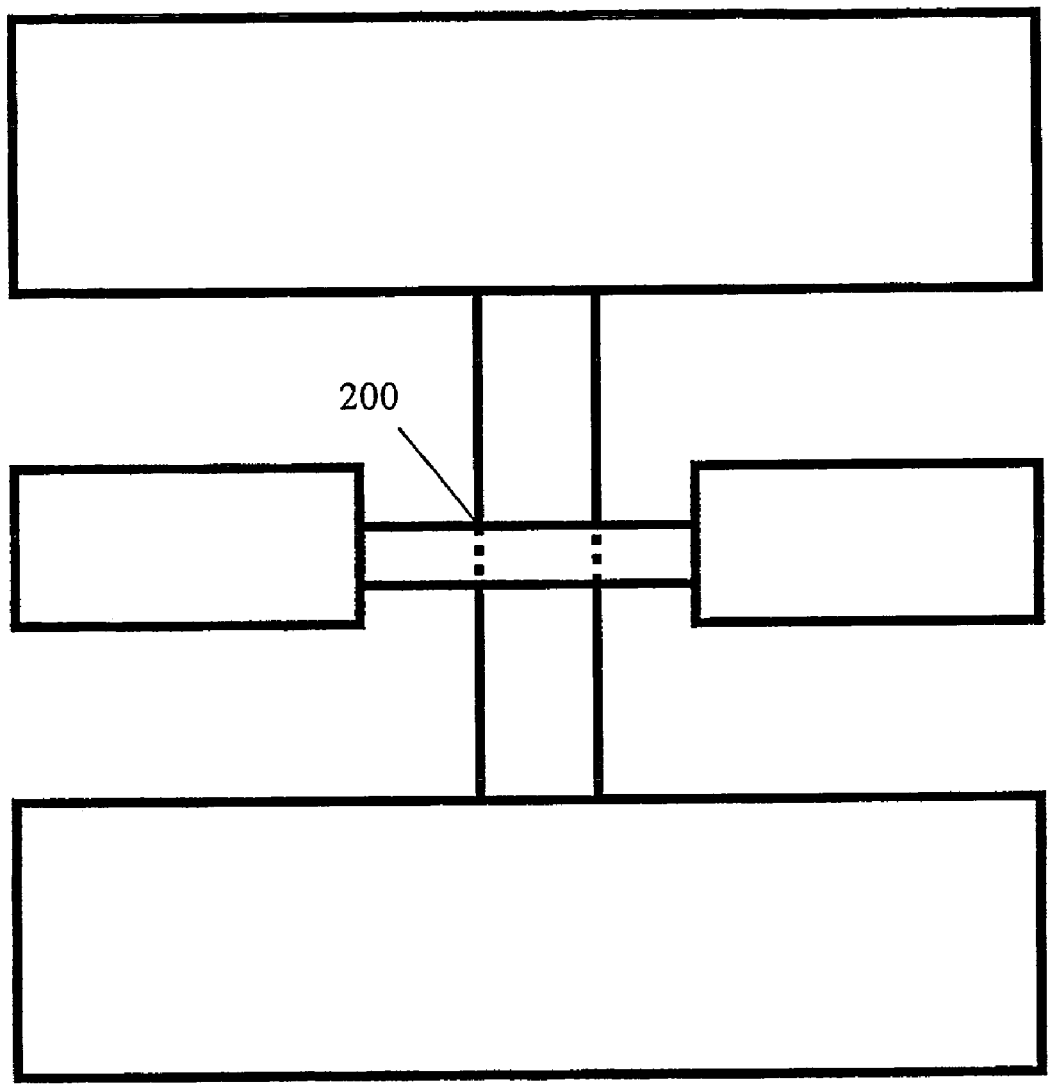
FIG. 2c is a top-view of a varactor according to one embodiment of the present invention.

The top view of the finalized CPW is shown in FIG. 2c. In FIG. 2c, the varactor area 200 is defined by the overlap area between the top metal electrode and the metallic layer indicated by the dashed lines. The bottom metallic layer 20 comprises two ground conductors with exactly the same dimensions as the CPW ground lines and a shunt conductor, connecting the two ground lines in the metal1 layer, seen as the dotted lines in FIG. 3. When the capacitance of the varactor is very high (at 0V bias), the signal is coupled through the varactor and passes through the shunt conductor to the ground. The varactor capacitance is in series with the larger capacitance introduced by the overlapping of the ground conductors in the top metal electrode (metal2) and the bottom metallic layer (metal1). The output is isolated from the input because of the signal being shunted to ground at 0V, resulting in the OFF state of the device. When one applies a dc voltage to the center conductor of the CPW in the metal2 layer, the dielectric constant of the ferroelectric thin-film is reduced and results in a lower varactor capacitance. When the varactor capacitance becomes small, the majority of signal from the input will be passed on to the output, because of reduced coupling by the varactor, resulting in the ON state of the device. Large dielectric tunability results in high isolation and low insertion loss of the device.

Figure 2D:
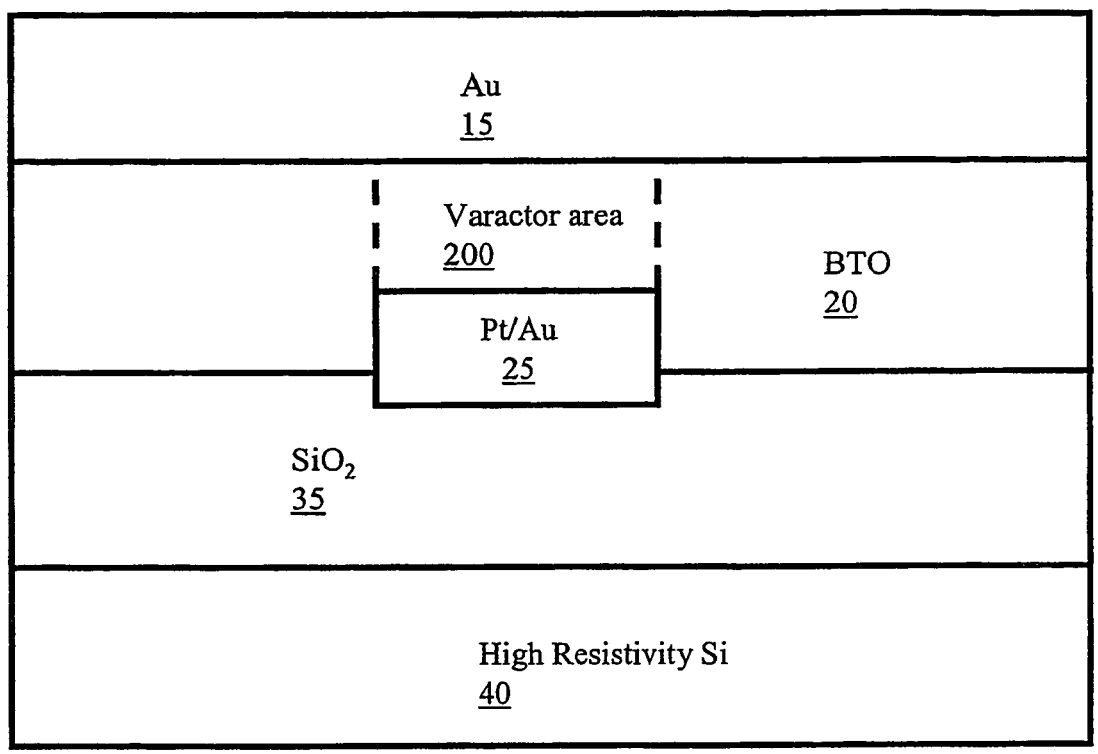
FIG. 2d is a cross-sectional view of the varactor area according to one embodiment of the present invention.

In the cross section of the varactor, see FIG. 2d, the widths of the two overlapping top metal electrode 15 and bottom metallic layer 25 are chosen such that a required value of capacitance is obtained based on the known relative permittivity ($\epsilon_r$) of the ferroelectric thin-film. Tuning is obtained if a DC electric field is applied between the ground conductors and the central signal strip of the CPW (using CPW probes). The DC field changes the relative permittivity of ferroelectric thin-film, and hence the capacitance of the varactor.

In one embodiment, the width of the center signal strip of the CPW and the spacing between the center signal strip and ground conductors were chosen so that the characteristic impedance is close to about 50 Ω and the line losses are minimized. The CPW line has the dimensions of Ground-Signal-Ground being 150 μm/50 μm/150 μm for DC-20 GHz on the high resistivity silicon substrate 35. The spacing (S) between the center signal strip and ground conductors is taken as 50 μm and the geometric ration (k=W/(W+2S)) is equal to 0.333 of the CPW line. The device area is approximately 450 μm by 500 μm. The varactor area, which is the overlap of the top metal electrode and the bottom metallic layer is approximately 75 μm$^2$.

The simple circuit implementation as the present invention is compatible with Si MMIC technology, wherein the need for vias is eliminated in this two metal layer process. The switch is in the normally "OFF" state compared to MEMS capacitive shunt switches which are in the normally "ON" state. In addition, these switches are capable of switching at ~30 ns switching speeds, where as the MEMS switches are slower (~10 μs). Further, a lower bias voltage (<10V) can be used compared to MEMS (40-50V) for switching. The varactor shunt switch can be designed for a bias voltage of less than 2 V.

The design trade between the isolation (OFF-state) and insertion (ON-state) loss depends on the varactor area and the dielectric constant of the BST thin-films. Large varactor area and high dielectric constant are required to get the high isolation but it will increase the insertion loss. To keep the insertion loss at a minimum (<1 dB), the optimized overlapping area and dielectric constant are taken as 25 μm² and 1200 respectively.

Figure 3:
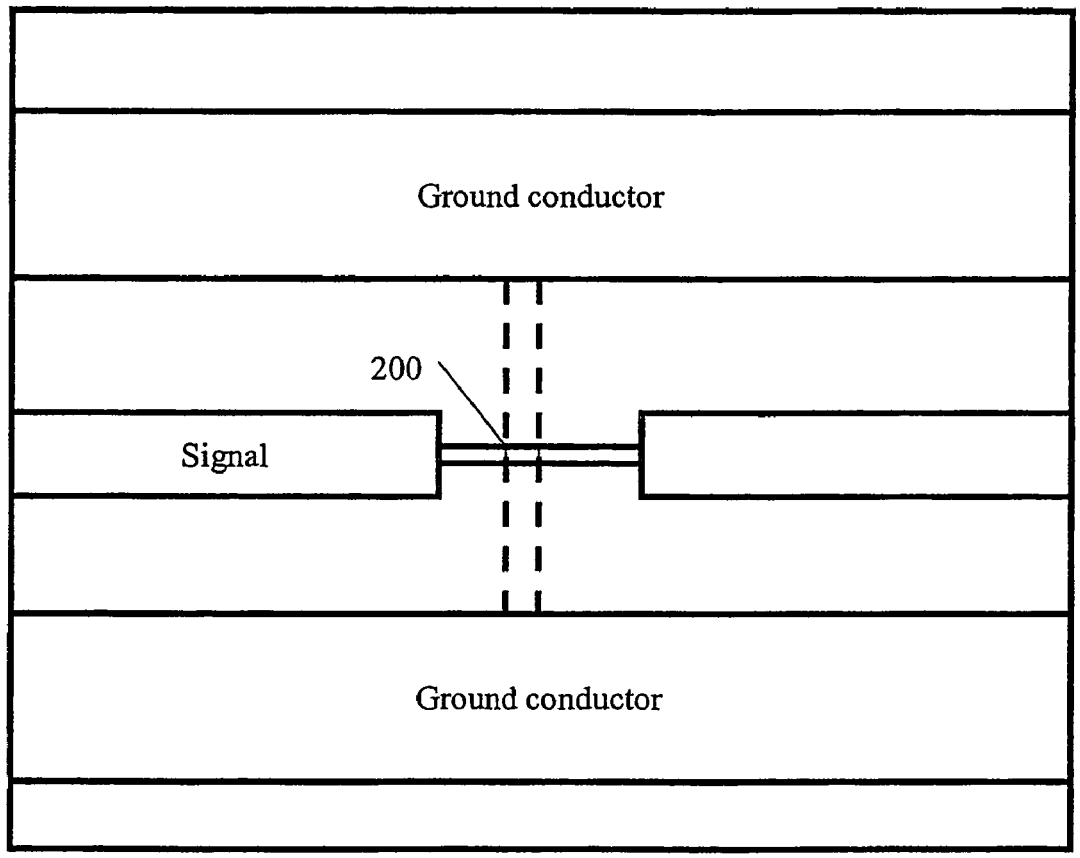
FIG. 3 illustrates a top view of the capacitive shunt switch according to one embodiment of the present invention.
Figure 4:
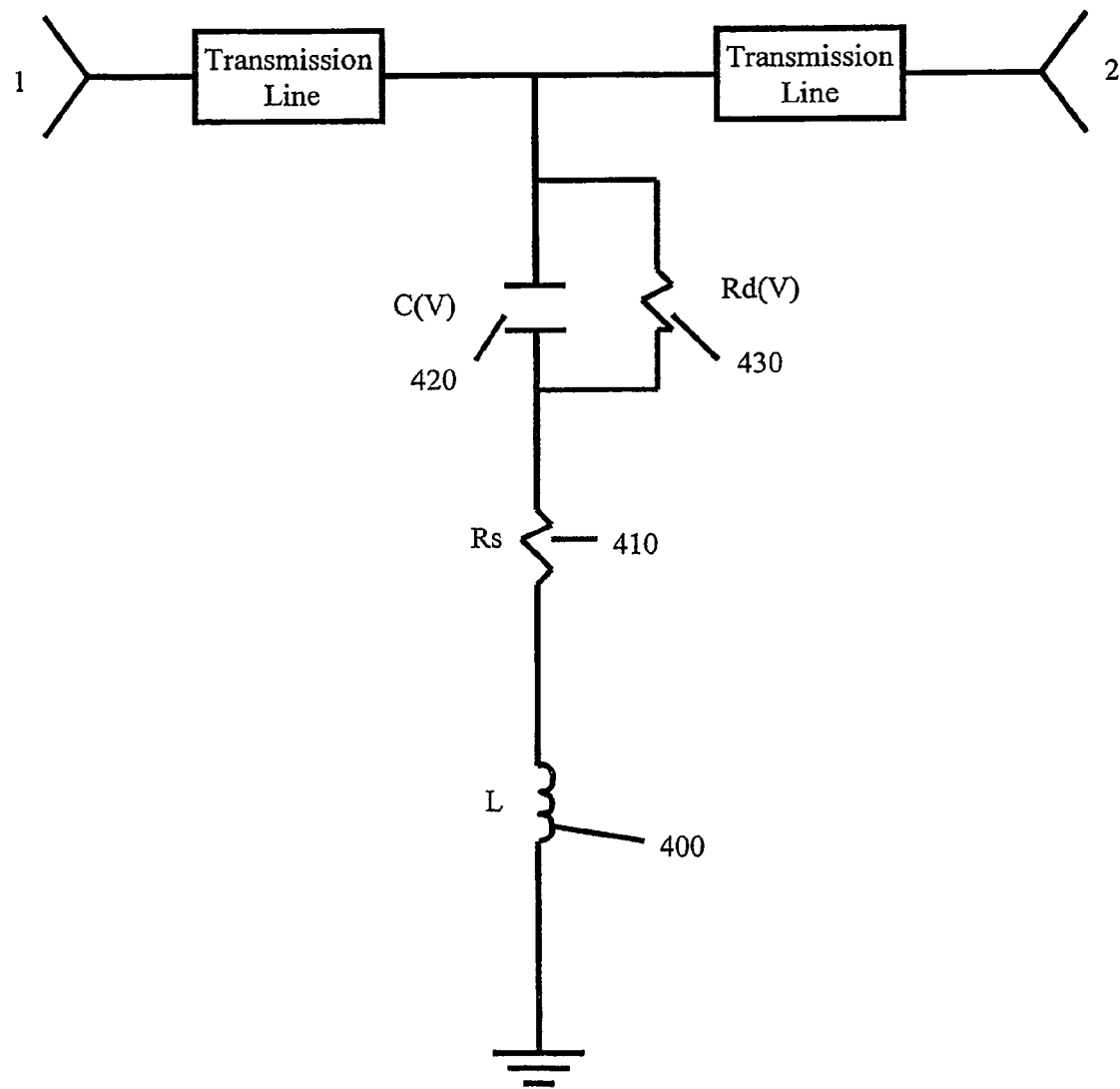
FIG. 4 represents the electric circuit model of the varactor shunt switch of FIG. 3 according to one embodiment of the present invention.

FIG. 4 represents the electric circuit model of the varactor shunt switch of FIG. 3. The electrical circuit model is obtained by shunting the varactor, with L 400 and Rs 410 being parasitic inductance and resistance respectively. The shunt resistance Rd 430 models the lossy (leakage conductance) nature of the varactor. The varactor capitance 420 can be obtained by the standard parallel plate capacitance calculation, with the dielectric permittivity of the BST thin-film, and the overlap area of the center signal strip and the shunt line. The varactor capacitance is given by:

$$Cv = \epsilon_0 \cdot \epsilon_{rf} \cdot A/t \quad (1)$$

Where $\epsilon_0$ is the dielectric permittivity of free space, $\epsilon_{rf}$ is the relative dielectric constant of the ferroelectric thin-film used, A is the area of the varactor, and t is the thickness of the ferroelectric thin-film.

The series resistance (Rs) 410 of the shunt conductor line in the bottom metal layer (metal1), where the signal is shunted to ground is calculated using Equation 2

$$R = l/(\sigma wt) \quad (2)$$

where, $\sigma$ is the conductivity of metal used in the top metal electrode, w is the width of the conductor, l is the length of the line shunting to ground, and t is the thickness of the conductor.

The inductance 400 (L) of the line is calculated using Equation (3)

$$L = (Z_0/(2\pi f)) \sin(2\pi i/\lambda_g) \quad (3)$$

where, $Z_0$ is the characteristic impedance of the CPW transmission line, f is the operating frequency, and $\lambda_g$ is the guide-wavelength.

The shunt resistance 430 (Rd) of the varactor can be calculated using Equation (4)

$$Rd(V) = 1/(\omega C(V) \tan \delta) \quad (4)$$

where, C(V) 420 is the capacitance of the varactor and $\tan \delta$ is the loss-tangent of the ferroelectric thin-film.

Figure 5:
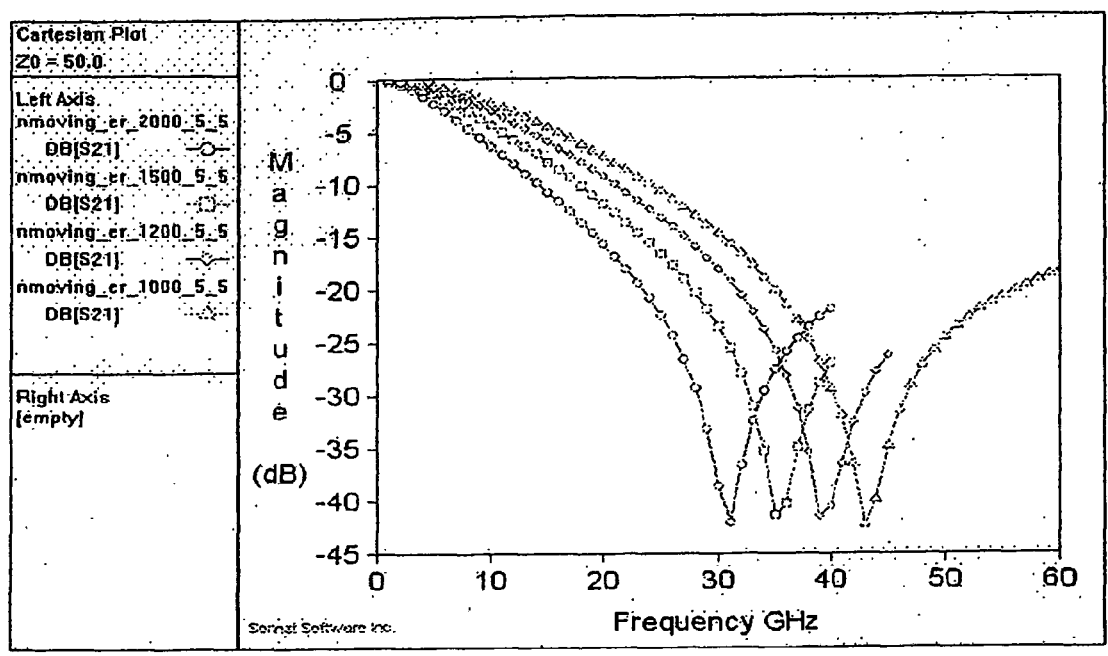
FIG. 5 illustrates simulated isolation using different dielectric constants with the same varactor area according to one embodiment of the present invention.

The performance (e.g., high isolation, low insertion loss, etc.) of the capacitive shunt switch depends on the dielectric tunability of the ferroelectric thin-film. High capacitance value will increase the isolation in the OFF-state but it will also increase the insertion loss in the ON-state. The capacitance value can be increased by using a high dielectric constant of the ferroelectric thin-films or large varactor area. Increasing the dielectric constant of the ferroelectric thin-films with same varactor area does not change the isolation very much but the resonance frequency decreases due to the increased varactor capacitance, see FIG. 5. FIG. 5 shows the isolation for the relative dielectric constants of 2000, 1500, 1200 and 1000 from left to right with a fixed varactor area of 5×5 μm².

Figure 6:
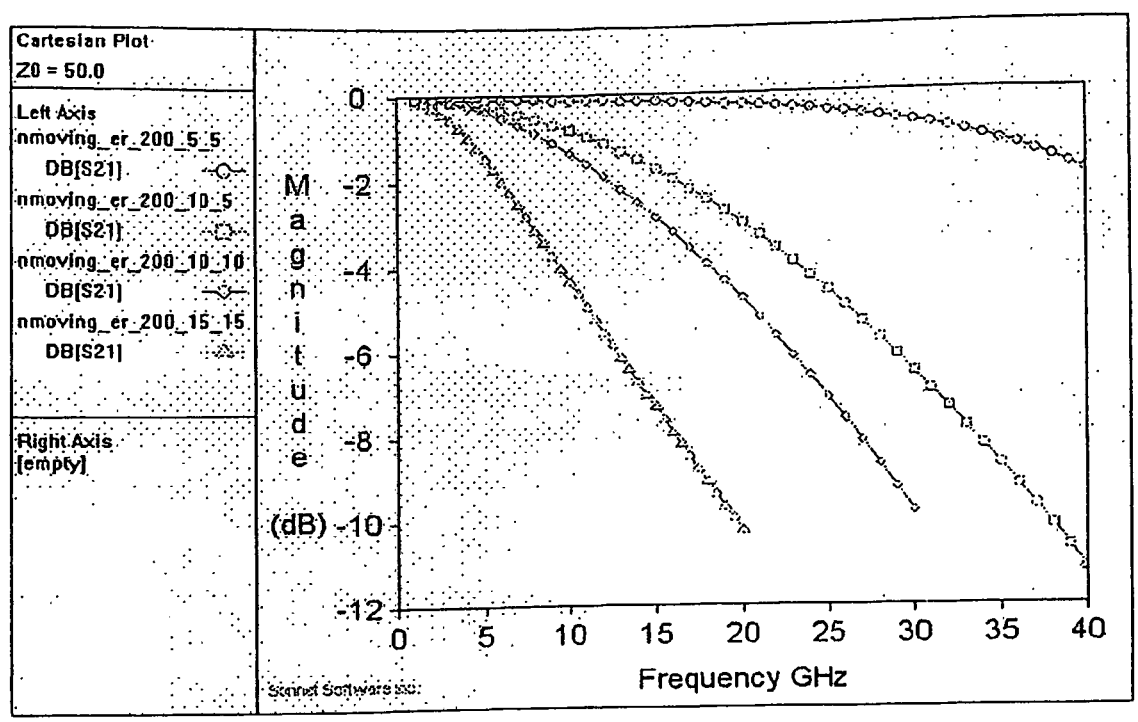
FIG. 6 illustrates simulated insertion loss using different varactor areas with the same dielectric constant according to one embodiment of the present invention.

Further, insertion losses increase with increasing varactor area as shown in FIG. 6. FIG. 6 illustrates the insertion loss for a fixed dielectric constant of value 200 with the varactor areas of 15×15 μm², 10×10 μm², 10×5 μm², and 5×5 μm² from left to right.

Figure 7:
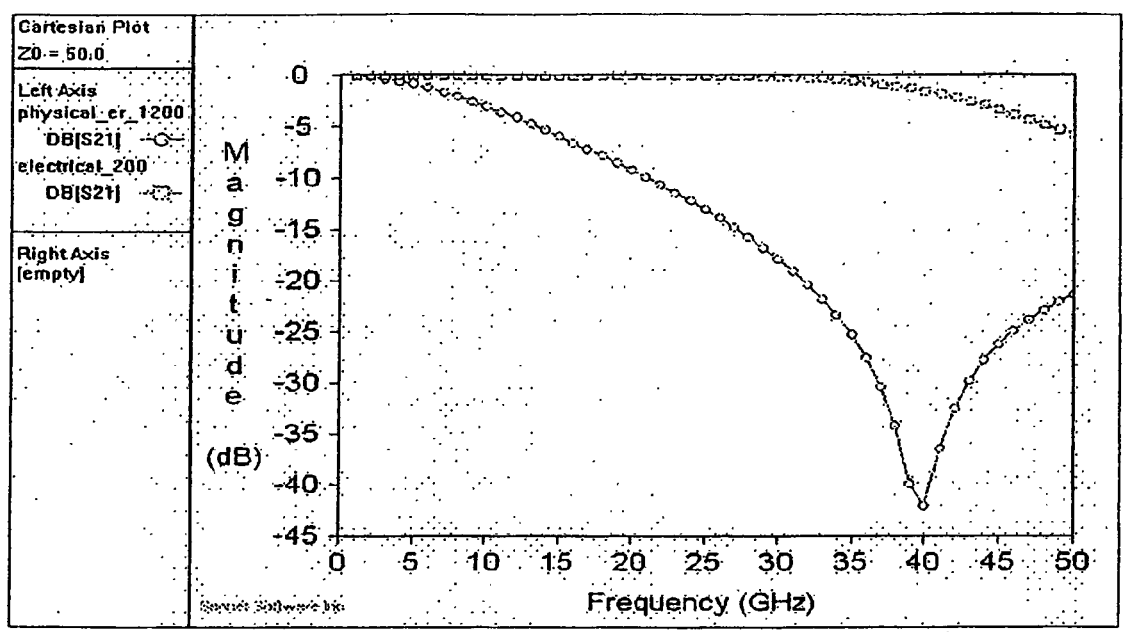
FIG. 7 illustrates simulated isolation and insertion loss of the varactor shunt switch for an optimized device according to one embodiment of the present invention.

The simulated optimized dielectric constant of ferroelectric thin-films is taken as 1200 for the OFF-state and 200 for the ON-state with a varactor area of 5×5 μm², or 25 μm². FIG. 7 illustrates the simulated isolation and insertion loss of the varactor shunt switch for the optimized device. The isolation of the device is better than 30 dB at 30 GHz and the insertion loss is below 1 dB below 30 GHz.

Figure 8:
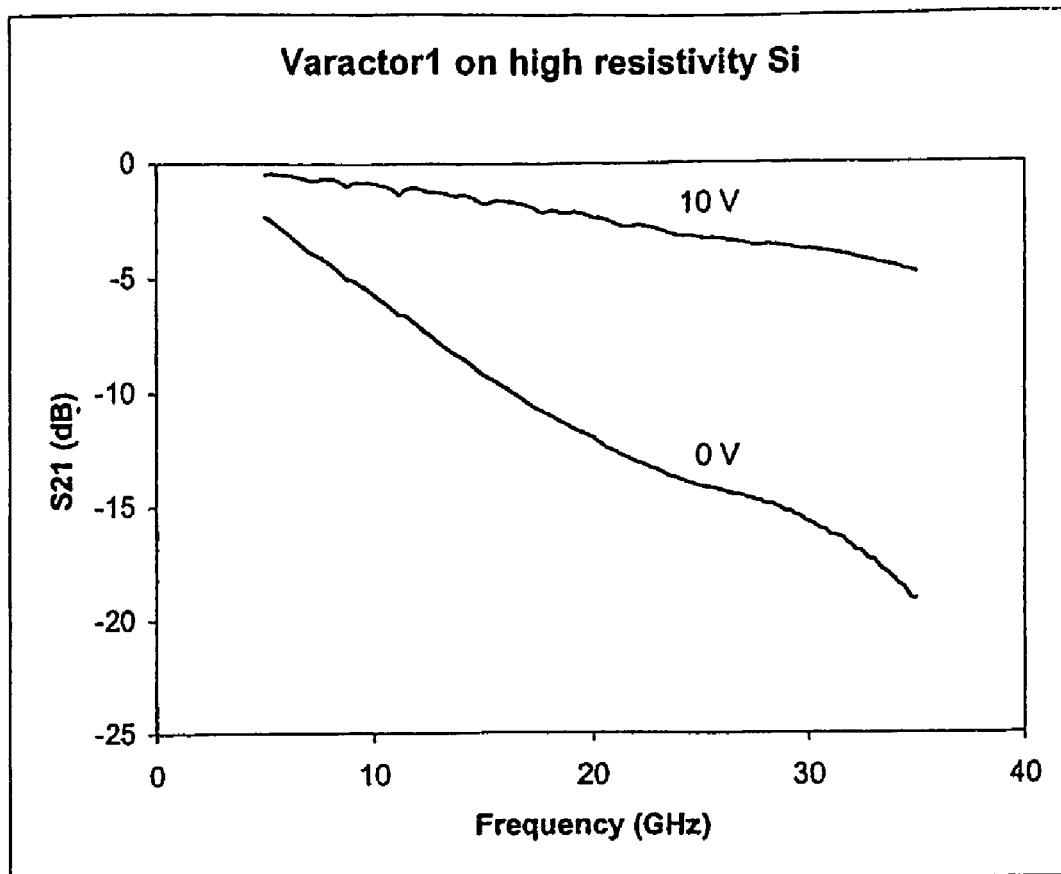
FIG. 8 illustrates experimental measurements on the varactor shunt switch according to one embodiment of the present invention.

The varactor shunt switch was tested using a HP 8510 Vector Network Analyzer (VNA). A Line-Reflect-Reflect-Match (LRRM) calibration was performed over a wide frequency range (5 to 35 GHz). The sample was then probed using standard GSG probes. The dc bias was applied through the bias tee of the VNA. FIG. 8 illustrates the experimental measurements performed on the varactor shunt switch for 0 V (i.e., the OFF state) and for 10 V dc bias (i.e., the ON state). In the measured device, the capacitance of the varactor at zero bias was about 0.85 pF and was reduced to about 0.25 pF for a bias voltage of 10 V, thereby, resulting in a dielectric tunability of more than 3:1.

Figure 9:
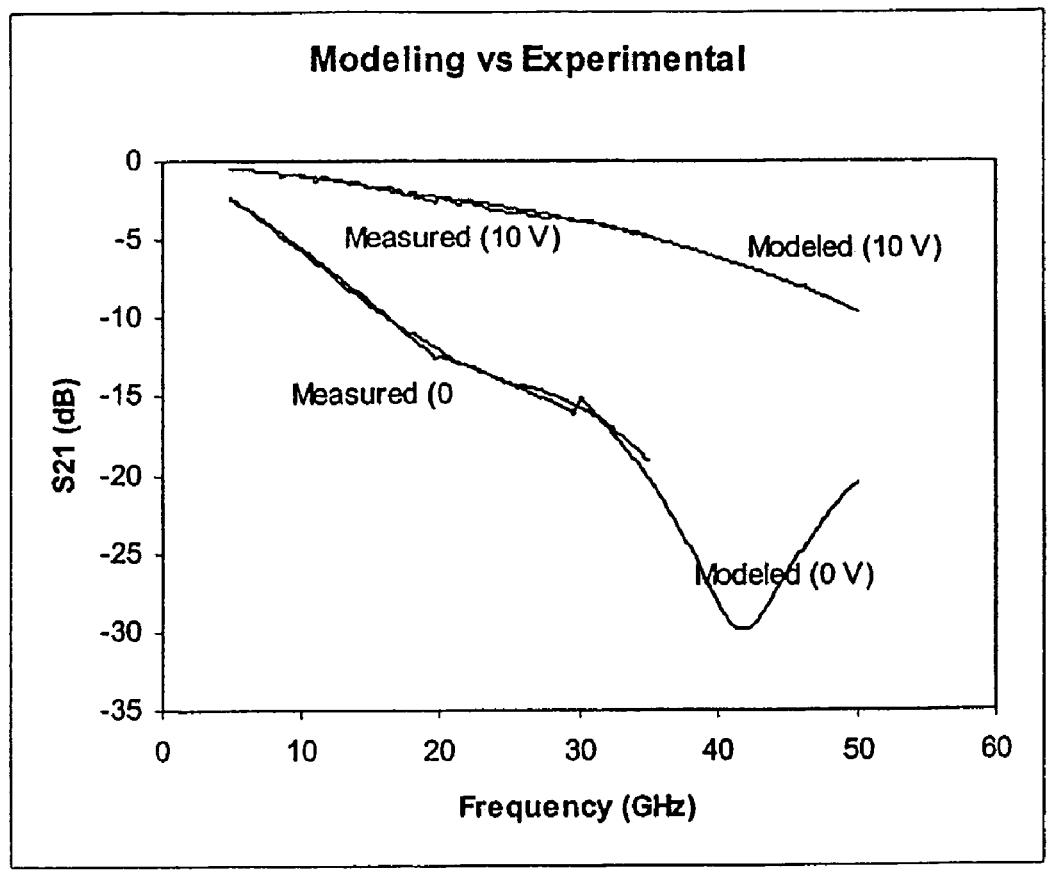
FIG. 9 illustrates experimental results versus the simulation results for the varactor shunt switch according to one embodiment of the present invention.

FIG. 9 illustrates the experimental results obtained from the varactor shunt switch compared to the simulation results based on the electrical model developed for the device. The experimental results were obtained up to 35 GHz. Theoretical simulations performed on the same device indicates that the isolation (off-state S21) improves to 30 dB near 41 GHz. A good agreement between the theoretical and experimental results over the frequency range of measurements can be seen as shown in FIG. 9. Therefore, the experimental data confirms the operation of the varactor shunt switch for microwave switching applications.

Table 1 demonstrates the comparison among solid-state switching devices, RF MEMS and the ferroelectric-based varactor shunt switch. The advantages of the varactor shunt switch include lower bias voltage requirement, high switching speed, ease of fabrication and high switching lifetime.

TABLE 1

| Device characteristics and performance parameter | Solid state switches | RF MEMS capacitive shunt switches | Ferroelectric varactor based shunt switch |
| --- | --- | --- | --- |
| Type of switch | Normally OFF or ON | Normally ON | Normally OFF |
| Actuation voltage | Low (3-8 V) | High (40-50 V) | Low (<10 V) |
| Switching speed | High (5-100 ns) | Low (~10 ms) | High (<100 ns) |
| Isolation (dB) | <20 db @ 20 GHz | Very high (>40 dB @ 30 GHz) | High (>20 dB @ 30 GHz) |
| Insertion loss (dB) | >1 db @ 30 GHz | Very low (<1 db @ 30 GHz) | Low (<1.5 dB @ 30 GHz) |
| Switching lifetime | High | Low | High |
| Packaging cost | Low | High | Low |
| Power handling | Poor (0.5-1 W) | Medium (<5 W) | High (>5 W) |
| Power consumption (OFF-state) | Low (1-20 mW) | Almost zero | Almost zero |
| Breakdown voltage | Low | High | High |
| DC resistance | High (1-5 Ω) | Low (<0.5 Ω) | Low (<0.5 Ω) |
| Linearity | Low | High | High |
| IP3 | Low (~+28 dBm) | High (~+55 dBm) | Not available |
| Integration capability | Very good | Very good | Very good |

Note that the ferroelectric varactor shunt switch performance predicted in the table are based on theoretical calculations.

It is noted that terms like "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

The invention claimed is:

1. A varactor shunt switch for microwave applications, the varactor shunt switch comprising:
   a high resistivity silicon layer;
   a silicon oxide layer on said high resistivity silicon layer;
   a tunable ferroelectric thin-film dielectric layer on said silicon oxide layer; and
   a top metal electrode on said tunable ferroelectric thin-film dielectric layer, wherein said top metal electrode defines a coplanar waveguide transmission line, wherein said top metal electrode comprises at least two ground conductors and a central signal strip.

2. The varactor shunt switch of claim 1, wherein said high resistivity silicon layer has a thickness of about 0.051 cms.

3. The varactor shunt switch of claim 1, wherein said high resistivity silicon layer has a resistivity of >1 kΩ-cm.

4. The varactor shunt switch of claim 1, wherein said silicon oxide layer has a thickness of about 200 nm.

5. The varactor shunt switch of claim 1, wherein said metallic layer further comprises:
   a gold layer on said adhesion layer; and
   a platinum layer on said gold layer.

6. The varactor shunt switch of claim 5, wherein said gold layer has a thickness of about 400 nm.

7. The varactor shunt switch of claim 5, wherein said platinum layer has a thickness of about 100 nm.

8. The varactor shunt switch of claim 1, wherein said metallic layer has a thickness of about 500 nm.

9. The varactor shunt switch of claim 1, wherein said metallic layer is deposited and lifted off by electron beam deposition and standard lift-off photolithography.

10. The varactor shunt switch of claim 1, wherein said metallic layer is deposited and lifted-off by sputtering and standard lift-off photolithography.

11. The varactor shunt switch of claim 1, wherein said metallic layer comprises of at least two ground conductors and a shunt conductor.

12. The varactor shunt switch of claim 11, wherein said at least two ground conductors have a width of about 150 μm.

13. The varactor shunt switch of claim 1, wherein said tunable ferroelectric thin-film dielectric layer is comprised from one of barium strontium titanium oxide, strontium titanate, or combinations of any other nonlinear electric field tunable dielectric thereof.

14. The varactor shunt switch of claim 1, wherein said tunable ferroelectric thin-film dielectric layer is comprised of barium strontium titanium oxide.

15. The varactor shunt switch of claim 1, wherein said tunable ferroelectric thin-film dielectric layer is deposited by pulsed layer deposition.

16. The varactor shunt switch of claim 1, wherein said tunable ferroelectric thin-film dielectric layer is deposited by RF sputtering.

17. The varactor shunt switch of claim 1, wherein a varactor area of said varactor shunt switch is defined by the overlap of said top metal electrode and said metallic layer.

18. The varactor shunt switch of claim 17, wherein said varactor areas between about 1 μm$^2$ to about 500 μm$^2$.

19. The varactor shunt switch of claim 17 has a shunt resistance equal to one divided the product of ω, the capacitance of said varactor area and the loss-tangent of the ferroelectric thin-film.

20. The varactor shunt switch of claim 19, wherein the lossy nature of said varactor is modeled by said shunt resistance.

21. The varactor shunt switch of claim 1, wherein said central signal strip has a width of about 50 μm.

22. The varactor shunt switch of claim 1, wherein said at least two ground conductors have a width of about 150 μm.

23. The varactor shunt switch of claim 1, wherein said top metal electrode has a spacing between said central signal strip and said at least two ground conductors of about 50 μm.

24. The varactor shunt switch of claim 1, wherein said top metal electrode has a spacing between said at least two ground conductors and said central signal strip that has a geometric ratio equal to about 0.333 of said coplanar waveguide transmission line.

25. The varactor shunt switch of claim 1, wherein said varactor shunt switch is normally in an "OFF" state at 0 V.

26. The varactor shunt switch of claim 1, wherein said coplanar waveguide transmission line has about 40 to about 50 Ω characteristic impedance.

27. The varactor shunt switch of claim 1 has an area of approximately 450 μm by approximately 500 μm.

28. The varactor shunt switch of claim 1 has a parasitic line inductance equal to the characteristic impedance of said coplanar waveguide transmission line divided the product of 2π and the operating frequency multiplied by the sine of the product of 2π and the length of the line shunting to ground divided by the guide-wavelength.

29. The varactor shunt switch of claim 1, wherein said tunable ferroelectric thin-film dielectric layer has a dielectric constant of greater or equal to about 200 at zero bias, an optimized dielectric constant of 1200, and a thickness of greater than 250 nm.

30. The varactor shunt switch of claim 1 further comprising an adhesion layer on said silicon oxide layer.

31. The varactor shunt switch of claim 30 further comprising a metallic layer disposed between the adhesion layer and the tunable ferroelectric thin-film dielectric layer.

32. The varactor shunt switch of claim 30, wherein said adhesion layer comprises of titanium.

33. The varactor shunt switch of claim 30, wherein said adhesion layer has a thickness of about 20 nm.

* * * * *